United States Patent [19]

Nojiri et al.

[11] Patent Number: 4,808,468
[45] Date of Patent: Feb. 28, 1989

[54] POLYIMIDE FILM AND ITS MANUFACTURING METHOD

[75] Inventors: Hitoshi Nojiri; Katuhiro Kitai; Yoshihide Ohnari; Masaro Kidoh, all of Ohtsu; Tsuneo Yamamoto, Kobe, all of Japan

[73] Assignee: Kanegafuchi Kagaku Kogyo Kabushiki Kaisha, Osaka, Japan

[21] Appl. No.: 88,326

[22] Filed: Aug. 21, 1987

[30] Foreign Application Priority Data

Sep. 1, 1986 [JP] Japan ................................ 61-205576
Sep. 1, 1986 [JP] Japan ................................ 61-205577

[51] Int. Cl.⁴ ............................................... B32B 7/00
[52] U.S. Cl. ................................ 428/220; 428/473.5; 528/183; 528/188
[58] Field of Search ........................... 428/220, 473.5; 528/183, 188

[56] References Cited

U.S. PATENT DOCUMENTS 4,753,842 6/1988 Okumura et al. ................. 428/220
4,761,327 8/1988 Hamano et al. .................. 428/220
4,761,328 8/1988 Shin .................................... 428/220

Primary Examiner—Morton Foelak
Attorney, Agent, or Firm—Armstrong, Nikaido, Marmelstein & Kubovcik

[57] ABSTRACT

The present invention provides a polyimide film whose residual content of volatiles is reduced to not more than 0.45 weight % on the basis of the film, and further a polyimide film whose residual content of volatiles is reduced to not more than 0.45 weight % on the basis of the film and whose oxygen/carbon ratio in the surface layer is increased by 0.01–0.1, and manufacturing methods therefor.

According to the present invention, it is possible to provide a polyimide film improved in adhesion performance in a stable and homogeneous manner, and this improvement of adhesion performance is attainable in the film-forming process, not in a separate process of after-treatment.

20 Claims, 1 Drawing Sheet

POLYIMIDE FILM AND ITS MANUFACTURING METHOD

BACKGROUND OF THE INVENTION

1. Field of the Invention

The present invention relates to a heat resistant polyimide film and its manufacturing method and, more particularly, to a polyimide film whose adhesion performance is improved by sizably reducing its residual content of volatiles from that of the conventional counterpart, and further by, besides reducing the residual content of volatiles, controlling the oxygen/carbon ratio of the surface layer, and the manufacturing method thereof.

2. Description of the Prior Art

A polyimide film is known for its outstanding properties such as high heat resistance, cold resistance, resistance to chemicals, electrical insulation performance and mechanical strength, and is being widely used as electric insulation film, heat insulation film and base film for flexible printed circuit board (PCB). In its principal field of application e.g. as material of PCB or electric insulation film, it is often the case that the film is bonded with copper foil by the use of a proper adhesive, used as material of prepreg which is prepared by coating with an adhesive or conjugating with a fluorine resin, hence a great importance is attached to its adhesion performance.

Hitherto, as adhesion performance-imparting techniques for high-polymer films have been known such treating methods as flame treatment, corona discharge treatment, ultraviolet ray treatment, alkali treatment, primer treatment and sandblast treatment. For treatment of polyimide film, too, common methods which can satisfy the purposes of a heat resistant film such as sandblast or alkali treatment have been used.

All these methods are, however, intended for improving its adhesion performance by after-treatment of commercialized films. Thus, any of these methods is not applicable to any film in the process of its manufacture or film forming for improving its adhesion performance, hence there has been sometimes problematic about varied adhesion performance of film before after-treatment as well as stability of after-treating method, homogeneity of film to be treated, and it has been basically difficult to supply stably films of improved adhesion performance. Moreover, commercialization of such a process requires a large amount of investment, this inevitably resulting in a rise of manufacturing cost. The same is the case with a film made by conjugation with e.g. fluorine resin, and it has been difficult to stably realize a film of high peeling strength by any of the conventional techniques.

SUMMARY OF THE INVENTION

It is a primary object of the present invention to provide stably a polyimide film of improved homogeneity and adhesion performance and the method for its manufacture.

Another object of the invention is to provide a polyimide film improved in adhesion performance on both sides and the method for its manufacture.

Still another object of the invention is provision of a polyimide film manufacturing method improving the adhesion performance of polyimide film in the process of film forming and not by any aftertreatment.

Other objects and advantages of the present invention will be readily appreciated by reference to the following detailed description.

In view of such current situation, the present inventors, after intensive research for accomplishing the above-mentioned objects have discovered that polyimide film of improved adhesion performance is obtainable by reducing the residual content of volatiles compared with that of the conventional counterpart, or by controlling the oxygen/carbon ratio of the surface layer, besides the reduction of the residual content of volatiles.

DETAILED DESCRIPTION OF THE INVENTION

Figure 1:
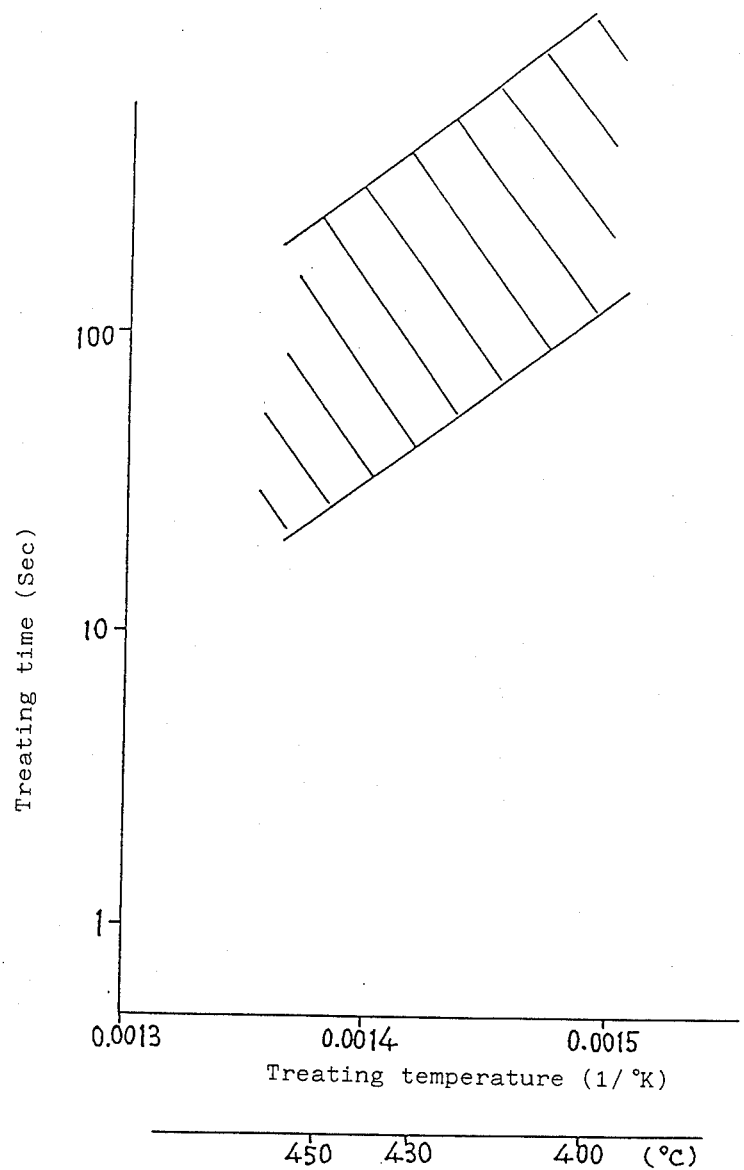
FIG. 1 is a graph showing the relationship between heat-treating temperature and heat-treating time.

The first feature of the present invention is provision of improved polyimide film with its residual content of volatiles reduced to not more than 0.45 weight % based on film, the second feature thereof is provision of a manufacturing method which comprises heating a polyimide film to reduce its residual content of volatiles to not more than 0.45 weight % based on film, the third feature thereof is provision of improved polyimide film with its residual content of volatiles reduced to not more than 0.45 weight % based on film and the oxygen/carbon ratio of the surface layer increased by 0.01–0.1, and the fourth feature is provision of a manufacturing method which comprises treating by the corona discharge a polyimide film with its residual content of volatiles reduced to not more than 0.45 weight % based on film.

The present inventors believed that the conventional polyimide film, manufactured by the so-called solvent cast method, had a brittle and mechanically weak surface layer, this adversely affecting the film's adhesion performance, and made intensive and extensive study for an effective method for improvement in this respect. It can be understood that the currently practiced sandblast treatment and the alkali treatment are both aimed at removal of this brittle and weak surface layer. Besides removal of this surface layer, however, great effort was made also for reform of the film as a whole, and as a result it was discovered that the film's adhesion performance depended largely on the residual content of volatiles of the entire film. For evaluation of a film's adhesion performance, various solvent-based adhesives are used, and the film coated with each adhesive is dried and then laminated by heating. Considering that a large variety of solvents are used for the purpose, it is quite remarkable that discovery was made of the fact that the film's adhesion performance depended largely on the residual content of volatiles. Also discovered was the fact that a film's adhesion performance can be improved by controlling its residual content of volatiles but not those attributable to the adhesive used, not necessarily accompanied by removal of the surface layer.

In the present invention, the film's residual content of volatiles excludes only water, and is defined by the following formula.

Residual content of volatiles
$(\%) = [(W_o - W)/W_o] \times 100$ where $W_o$: Weight after drying for 10 min. at 150° C.
$W$: Weight after heat treatment for 20 min. at 450° C.

The polyimide film of the present invention has its residual content of volatiles of not more than 0.45 weight % based on film. If this limit is exceeded, it is difficult to obtain a film satisfactory in adhesion performance. Preferably, the said content may be within a range of 0.15-0.4 weight %. When it is less than 0.15 weight %, it may occasionally be undesirable, resulting in lowering of mechanical properties.

The polyimide film of the present invention is obtainable from a variety of known materials, and there is no limitation in this respect. Considering the balancing of the film's properties, however, the polyimide film consisting of poly-[N,N'-P,P'-oxydiphenilene-pyromellit]-imide. As a method of manufacturing polyimide film may be used either one employing imidizing agent (chemical cure method) or one only by heating (dry up method), but preferably by the chemical cure method, which gives a better result.

Nor there is any limitation with regard to the thickness of polyimide film of the present invention but it may preferably be in a range of 10-125 μm, and more preferably 50-125 μm.

The effect of the present invention is particularly remarkable when the film's thickness is more than 50 μm. While the conventional polyimide film had weak points of requiring a lot of efforts and cost for after-treatment for improving its adhesion performance and, worse, it was difficult to attain said effect on both sides of film, the present invention readily enables the said improvement on both sides of film.

As a concrete method for reducing the residual content of volatiles to not more than 0.45 weight % may be exemplified a method of giving heat treatment.

The method consists in giving a heat treatment for a necessary time at a temperature of not lower than 300° C. and the necessary time and temperature can be readily set within the range required for attaining the objects of the present invention. In this regard, preferred and effective range may be one shown in FIG. 1 with parallel, diagonal lines.

The conditions of heat treatment of the present invention are set for the manufacturing process with its maximum temperature, but the treatment may not necessarily be given within the manufacturing process, and it is as well possible to give it in a separate process.

In the present invention, the adhesion performance may be much more enhanced by increasing the oxygen/carbon ratio in the film's surface layer by 0.01 to 0.1, preferably 0.02 to 0.09, as compared with the conventional polyimide film.

The oxygen/carbon ratio in the film's surface layer referred to in connection with the present invention can be shown by the difference between the oxygen/carbon ratio in the film's surface layer and that of polished surface layer of film, which is determinable by the use of XPS.

As concrete methods for increasing the oxygen/carbon ratio in the film's surface layer are exemplified corona discharge and plasma-treating process. Preferred is, however, the corona treatment, for the plasma treatment requires a large investment in facilities. With the corona discharge treatment it is easily feasible for accomplishment of the object of the present invention both one-side and both-side treatment as well as partial treatment, also feasible being proper setting of treating level and frequency or times of treatment. Recommended conditions are, for instance, 10-1,000 W/m²/minute, and preferably 30-600 W/m²/minute.

Although the method of the present invention is for controlling the film's residual content of volatiles or controlling the oxygen/carbon ratio as well as the residual content of volatiles for improving its adhesive performance, it is not necessarily be practiced alone and it is as well possible, if necessary, to use it in combination with any of the known after-treating methods.

As to the adhesion performance of polyimide film, there has been no report to date concerning the relationship between the film's adhesion performance and its residual content of volatiles. The present inventors discovered, for the first time, the possibility of improving the polyimide film's adhesion performance by controlling the film's residual content of volatiles or controlling both the residual content of volatiles and the oxygen/carbon ratio. Although its mechanism is not yet necessarily apparent, it is presumed that it is due to removal of the volatiles affecting the film's adhesion performance in the process of reducing the film's residual content of volatiles to 0.45 weight % or below, and further that the film's residual content of volatiles contains some substance which retard the effect of treatment for increasing the oxygen content of the surface layer, and the effect of the present invention is further improved by reduction or even elimination of such substance together with the residual volatiles.

By the use of the present invention, it is possible to directly impart adhesion performance, which has been considered difficult. Also, though the polyimide excellent in adhesion performance on both sides has not yet been provided, the present invention enables easily improving the film's adhesive performance on both sides. Further, since it is no after-treatment, there is no necessity of any separate process. This is advantageous not only in the required investment in equipment but also in the possibility of overcoming the instability such as fluctuation or even loss of adhesion performance caused by after-treating methods, being thus extremely advantageous and cheap. By the use of the present invention, it is possible to attain a high level of adhesion performance which cannot be hoped for by any ordinary surface treating method. Also, according to the present invention, it is also possible to impart adhesion performance to thick films 50-125 μm in thickness for which none of the conventional methods was effective. Also, according to the present invention, it is also possible to stably improve the peeling strength of films made by conjugation with fluorine resin.

Explained below concretely is the present invention by way of examples but it is to be understood that the present invention is limited in no way thereby.

EXAMPLES 1-4

A polyimide film 50 μm in thickness was prepared with pyromellitic acid dianhydride and 4,4'-diaminodiphenyl ether as material.

This film was heat-treated for reducing its residual content of volatiles and its adhesion performance etc. were measured. The result is shown in Table 1.

CONTROL EXAMPLE 1

A polyimide film 50 μm in thickness was prepared in the same way as Examples 1-4 but without heat treatment, and its adhesion performance was examined. The result is shown in Table 1.

EXAMPLES 5 AND 6

Polyamide films 75 μm and 125 μm in thickness respectively were prepared in the same way as Examples 1–4. This film was heat-treated for 1 min. at 450° C. and then their adhesion performances etc. were measured. The result is shown in Table 1.

CONTROL EXAMPLES 2 AND 3

Polyimide films 75 μm and 125 μm in thickness were prepared in the same way as Examples 5 and 6 and then their adhesion performances etc. were measured. The result is shown in Table 1.

TABLE 1

|  | Residual content of volatiles (Wt. %) | Adhesion strength | | Elongation at break | |
|---|---|---|---|---|---|
|  |  | A-side | B-side | MD | TD |
| Example 1 | 0.05 | All C/A | All C/A | 56 | 61 |
| Example 2 | 0.10 | 2.5 4/6 | 2.3 3/6 | 83 | 79 |
| Example 3 | 0.27 | 2.2 | 2.0 | 90 | 88 |
| Example 4 | 0.44 | 2.0 | 1.8 | 89 | 92 |
| Ctr. Example 1 | 0.55 | 1.3 | 1.0 | 85 | 80 |
| Example 5 | 0.38 | 2.2 | 2.1 | 90 | 87 |
| Example 6 | 0.40 | 2.1 | 2.1 | 93 | 95 |
| Ctr. Example 2 | 0.52 | 0.6 | 0.7 | 95 | 87 |
| Ctr. Example 3 | 0.55 | 0.8 | 0.7 | 93 | 91 |

Note (1) Adhesion strength Adhesive: Nylon/epoxy type Pattern width: 1.5 mm wide (copper foil 35 μm) Peeling at 90° C., 500 mm/min.
Note (2) Elongation at break 1.5 mm wide Chuck interval: 100 mm Test speed: 200 mm/min.
Note (3) Given in Table 1 are the figures in kg/cm showing the adhesion strength between polyimide film and adhesive. All C/A: All 6 samples showed adhesion failure between copper foil/adhesive. X/6: Of all 6 samples, C/A failure resulted in X-pieces.

EXAMPLES 7–9

As shown in Table 2, polyimide films of different kinds 50 μm in thickness were prepared in the same way as the examples 1–4, and the relationship between residual content of volatiles and adhesion strength was examined. The result is shown in Table 2.

TABLE 2

|  | Acid anhydride | Diamine | Residual content of volatiles (wt. %) | Adhesion strength | |
|---|---|---|---|---|---|
|  |  |  |  | A-side | B-side |
| Example 7 | PMDA | PPD/ODA = 1/4 | 0.312 | 2.2 | 2.0 |
| Example 8 | BPDA | PPD | 0.286 | 2.1 | 2.0 |
| Example 9 | BPDA | ODA | 0.339 | 2.0 | 2.1 |

PMDA: Pyromellitic acid dianhydride
BPDA: 3,3',4,4'-biphenyltetracarboxylic acid dianhydride
PPD: Paraphenylene diamine
ODA: 4,4'-diaminodiphyenyl ether

EXAMPLE 10

Surface-treated FEP-film 12.5 μm thick was hot laminated on one side of 50 m-thick polyimide film of Example 3 for preparation of a composite film, it was then heat-sealed "FEP on FEP" and T-peeling test was made at a test speed of 300 mm/min. The result was excellent being 300 g/0.5 inch wide in peeling strength.

CONTROL EXAMPLE 4

With polyimide film of Control Example 1 the peeling strength was measured in the same way as described in Example 10, and the result was 150 g/0.5 inch in width.

EXAMPLES 11–14

A polyimide film 50 μm thickness was prepared with pyromellitic acid dianhydride and 4,4'-diamino-diphenyl ether as material.

This film was further heat-treated for reducing its residual content of volatiles and the resulting film, both sides thereof, was treated by the corona discharge process under the conditions of 200 W/m²/minute.

With this film the residual content of volatiles, increase of the oxygen/carbon ratio of the film's surface layer and adhesion performance etc. were measured. The result is shown in Table 3.

Table 3 reveals that the adhesion performance was improved to such a degree that the breakage took place between the adhesive and the copper foil.

CONTROL EXAMPLE 5

Adhesive strength etc. of the same film as in Example 1 were measured and the obtained result is shown in Table 3.

CONTROL EXAMPLES 6–8

A polyimide film 50 μm in thickness was prepared in the same way as Examples 11–14 and the result of measurements taken of adhesive strength etc. is shown in Table 3 as that of CONTROL EXAMPLE 6.

Further, the film of the Control Example 6 were corona discharge-treated once and 10 times respectively and their adhesive strengths were measured, the results of which are shown as those of Control Examples 7 and 8.

From the results shown in Table 3 it is well understandable that in Control Examples 6–8, the adhesion strength attainable is insufficient or much less impressive, even if it is increased. It is also apparent from Control Example 8 that film's adhesion performance is unsatisfactory even after repeated after-treatment. Moreover, in Control Example 5, adhesion performance is satisfactory but elongation is not always perfect.

EXAMPLES 15–17

Polyimide film 75 μm thick was prepared in the same way as Examples 11–14.

The film was heat-treated for 1 minute at 450° C., and then further treated by the corona discharge and plasma processes to prepare films different in the degree of increase in the oxygen/carbon ratio of its surface layer. The adhesive strength attainable etc. were measured and the result is shown in Table 3. It is apparent that the present invention enables preparation of films highly improved in adhesion performance.

CONTROL EXAMPLES 9–11

Polyimide film 75 μm thick was prepared in the same way as Examples 15–17 and with it the adhesive strength attainable was measured. The result is shown in the table as that of CONTROL EXAMPLE 9.

The film was corona discharge-treated once and 20 times under the conditions of 400 W/m$^2$/minute and the results are shown in Table 3 as those for Control Examples 10 and 11. It is apparent that the result is unsatisfactory compared with that attainable by the present invention.

TABLE 3

|  | Residual content of volatiles (Wt. %) | Increase of Ox./c ratio | Adhesion strength | | Elongation at break | |
|---|---|---|---|---|---|---|
|  |  |  | A-side | B-side | MD | TD |
| Ex. 11 | 0.05 | 0.047 | All C/A | All C/A | 56 | 61 |
| Ex. 12 | 0.11 | 0.050 | All C/A | All C/A | 81 | 78 |
| Ex. 13 | 0.28 | 0.039 | All C/A | All C/A | 89 | 84 |
| Ex. 14 | 0.44 | 0.055 | 2.4 5/6 | 2.3 3/6 | 86 | 91 |
| C. Ex. 5 | 0.05 | 0.000 | All C/A | All C/A | 56 | 61 |
| C. Ex. 6 | 0.55 | 0.000 | 1.3 | 1.0 | 85 | 80 |
| C. Ex. 7 | 0.53 | 0.038 | 1.0 | 1.1 | 92 | 88 |
| C. Ex. 8 | 0.56 | 0.042 | 1.5 | 1.6 | 93 | 85 |
| Ex. 15 | 0.40 | 0.022 | 2.3 2/6 | 2.4 3/6 | 92 | 93 |
| Ex. 16 | 0.38 | 0.075 | 2.5 4/6 | 2.4 3/6 | 86 | 89 |
| Ex. 17 | 0.37 | 0.090 | 2.7 5/6 | All C/A | 90 | 91 |
| C. Ex. 9 | 0.52 | 0.000 | 0.6 | 0.7 | 95 | 87 |
| C. Ex. 10 | 0.50 | 0.045 | 0.7 | 0.7 | 92 | 95 |
| C. Ex. 11 | 0.53 | 0.060 | 1.3 | 1.4 | 92 | 89 |

EXAMPLES 18-21

As shown in Table 4 polyimide films of different kinds 50 μm in thickness were prepared in the same way as Examples 11-14, and the residual content of volatiles, increase in oxygen/carbon ratio of surface layer and adhesive strength attainable etc. were examined. The result is shown in Table 4.

From the tabulated data, it is apparent that the present invention affords films of high adhesion performance.

TABLE 4

|  | Acid anhydride | Diamine | Residual content of volatiles (wt. %) | Increase of Ox/C ratio | Adhesion strength | |
|---|---|---|---|---|---|---|
|  |  |  |  |  | A-side | B-side |
| Ex. 18 | PMDA | PPD | 0.326 | 0.032 | 2.5 4/6 | 2.4 3/6 |
| Ex. 19 | BPDA | ODA | 0.382 | 0.045 | 2.4 3/6 | 2.4 3/6 |
| Ex. 20 | BPDA | PPD | 0.431 | 0.035 | 2.3 2/6 | 2.5 2/6 |
| Ex. 21 | PMDA | PPD1/ODA4 | 0.237 | 0.029 | 2.5 5/6 | 2.3 5/6 |

Note (1)
PMDA: Pyromellitic acid dianhydride
BPDA: 3,3′,4,4′-biphenyltetracarboxylic acid dianhydride
PPD: Paraphenylene diamine
ODA: 4,4′-diaminodiphyenyl ether
Note (2)
PPD1/ODA4 means a ratio of 4 mols of ODA to 1 mol of PPD.

EXAMPLE 22

Surface-treated FEP-film 12.5 μm thick was hot laminated on one side of 50 μm-thick polyimide film of Example 13 for preparation of a composite film, and it was then heat-sealed "FEP on FEP" and T-peeling test was made at a test speed of 300 mm/min. The result was excellent, being 400 g/0.5 inch in width in peeling strength.

CONTROL EXAMPLE 12

With polyimide film of Control Example 4, the peeling strength was measured in otherwise the same way as described in Example 22, and the result was 150 g/0.5 inch in width.

CONTROL EXAMPLE 13

With polyimide film of Control Example 6, the peeling strength was measured in otherwise the same way as described in Example 22, and the result was 300 g/0.5 inch in width.

What is claimed is:

1. A polyimide film characterized in that its residual content of volatiles is reduced to not more than 0.45 weight % based on the film.

2. A polyimide film in accordance with claim 1, wherein it consists of poly-[N,N′-P,P′-oxydiphenylene-pyromellit]-imide.

3. A polyimide film in accordance with claim 1 or 2, wherein its thickness is in a range of 10-125 μm.

4. A polyimide film in accordance with claim 3, wherein its thickness is in a range of 50-125 μm.

5. A polyimide film manufacturing method characterized in that said film is heat-treated to reduce its residual content of volatiles to not more than 0.45 weight % based on the film.

6. A polyimide film manufacturing method in accordance with claim 5, wherein the film consists of [N,N′-P,P′-oxydiphenylene-pyromellit]-imide.

7. A polyimide film manufacturing method in accordance with claim 5 or 6, wherein the film is 10-125 μm thick.

8. A polyimide film manufacturing method in accordance with claim 7, wherein the film is 50-125 μm thick.

9. A polyimide film manufacturing method in accordance with claim 5, wherein it is produced by the chemical cure method using an imidizing agent.

10. A polyimide film characterized in that its residual content of volatiles is reduced to not more than 0.45 weight % based on the film and the oxygen/carbon ratio of the surface layer is increased by 0.01-0.1.

11. A polyimide film in accordance with claim 10, wherein it consists of poly-[N,N′-P,P′-oxydiphenylene-pyromellit]-imide.

12. A polyimide film in accordance with claim 10 or 11, wherein its thickness is in a range of 10-125 μm.

13. A polyimide film in accordance with claim 12, wherein its thickness is in a range of 50-125 μm.

14. A polyimide film manufacturing method characterized in that a polyimide film with its residual content of volatiles of not more than 0.45 weight % based on the film is treated by the corona discharge or plasma treating process.

15. A polyimide film manufacturing method in accordance with claim 14, wherein the corona discharge treatment is carried out under conditions of 10-1,000 W/m$^2$/minute.

16. A polyimide film manufacturing method in accordance with claim 15, wherein the corona discharge treatment is carried out under conditions of 30-600 W/m²/minute.

17. A polyimide film manufacturing method in accordance with claim 14, wherein the film consists of poly-[N,N'-P,P'-oxydiphenylene-pyromellit]-imide.

18. A polyimide film manufacturing method in accordance with claim 14, wherein the film thickness is in a range of 10-125 μm.

19. A polyimide film manufacturing method in accordance with claim 18, wherein the film thickness is in a range of 50-125 μm.

20. A polyimide film manufacturing method in accordance with claim 14, wherein the file is produced by chemical cure method using an imidizing agent.

* * * * *